United States Patent
Ji

(10) Patent No.: US 12,283,304 B2
(45) Date of Patent: Apr. 22, 2025

(54) MEMORY SYSTEM AND APPARATUS FOR EVICTING COLD DATA FROM VOLATILE MEMORY AND STORING THE EVICTED COLD DATA INTO THE NON-VOLATILE MEMORY

(71) Applicant: SK hynix Inc., Gyeonggi-do (KR)

(72) Inventor: Hyeong Tak Ji, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 267 days.

(21) Appl. No.: 17/970,103

(22) Filed: Oct. 20, 2022

(65) Prior Publication Data
US 2023/0386552 A1    Nov. 30, 2023

(30) Foreign Application Priority Data

May 25, 2022    (KR) .......................... 10-2022-0063836

(51) Int. Cl.
   *G11C 11/406*    (2006.01)
   *G11C 11/408*    (2006.01)

(52) U.S. Cl.
   CPC .. *G11C 11/40622* (2013.01); *G11C 11/40615* (2013.01); *G11C 11/4085* (2013.01)

(58) Field of Classification Search
   CPC ........ G11C 11/40622; G11C 11/40615; G11C 11/4085; G11C 11/4087; G11C 7/1006; G11C 11/40611; G06F 3/0659
   See application file for complete search history.

(56) References Cited

U.S. PATENT DOCUMENTS

| | | | |
|---|---|---|---|
| 2009/0172267 A1* | 7/2009 | Oribe ................. | G11C 16/3418 |
| | | | 711/E12.008 |
| 2015/0206574 A1* | 7/2015 | Greathouse ........ | G11C 14/0018 |
| | | | 711/103 |
| 2018/0342281 A1* | 11/2018 | Yoo ..................... | G11C 11/4085 |
| 2020/0066329 A1* | 2/2020 | Son ..................... | G11C 11/40611 |
| 2021/0073118 A1* | 3/2021 | Masuo ................. | G06F 3/0679 |
| 2021/0357329 A1* | 11/2021 | Oh ...................... | G06F 12/0891 |
| 2021/0365210 A1* | 11/2021 | He ....................... | G06F 3/0659 |
| 2022/0291853 A1* | 9/2022 | He ....................... | G06F 3/0611 |
| 2023/0068529 A1* | 3/2023 | Walker ................. | G06F 3/0604 |

FOREIGN PATENT DOCUMENTS

KR    10-2113212 B1    5/2020

* cited by examiner

*Primary Examiner* — Mushfique Siddique
(74) *Attorney, Agent, or Firm* — IP & T GROUP LLP

(57) ABSTRACT

A memory system may include: a non-volatile memory device, a volatile memory device suitable for defining, as cold data, data stored in a word line, on which a refresh operation is performed a number of times greater than a reference number among a plurality of word lines coupled to a volatile memory cell array, and evicting the cold data, and a controller suitable for controlling operations of the volatile memory device and the non-volatile memory device, and storing the evicted cold data into the non-volatile memory device.

18 Claims, 10 Drawing Sheets

FIG. 6

| TBR_ADD <1:5> | TBR_CNT <1:5> |
|---|---|
| 5 | 350 |
| 15 | 300 |
| 12 | 280 |
| 20 | 1 |
| EMPTY | EMPTY |

24

ST_CNT=350

FIG. 7

| TBR_ADD <1:5> | TBR_CNT <1:5> |
|---|---|
| 5 | 350 |
| 15 | 300 |
| 12 | 280 |
| 20 | 1 |
| 30 | 1 |

24
241
242
ST_CNT=350
← REF_ADD: 30 / REF_CNT: 1

FIG. 8

| TBR_ADD <1:5> | TBR_CNT <1:5> |
|---|---|
| 5 | 350 |
| 15 | 300 |
| 12 | 280 |
| 20 -> 50 | 1 |
| 30 | 1 |

ST_CNT=350

←— REF_ADD: 50 / REF_CNT: 1

| TBR_ADD<br><1:5> | TBR_CNT<br><1:5> |
|---|---|
| 5 | 350 |
| 15 | 300 |
| 12 | 280 |
| 50 | 1 |
| 30 | 1 |

24
241 242

SINCE REF_CNT IS GREATER THAN ST_CNT, ROW ADDRESS IS DETECTED FROM REFRESH TABLE

ST_CNT=350

REF_ADD: 5 / REF_CNT: 350 + 1

FIG. 10

| TBR_ADD<br><1:5> | TBR_CNT<br><1:5> | |
|---|---|---|
| EMPTY | EMPTY | ST_CNT=350 |
| 15 | 300 | → SINCE COLA_ADD IS 15, ROW ADDRESS IS DETECTED FROM REFRESH TABLE |
| 12 | 280 | |
| 50 | 1 | |
| 30 | 1 | |

MEMORY SYSTEM AND APPARATUS FOR EVICTING COLD DATA FROM VOLATILE MEMORY AND STORING THE EVICTED COLD DATA INTO THE NON-VOLATILE MEMORY

CROSS-REFERENCE TO RELATED APPLICATION(S)

The present application claims priority under 35 U.S.C. § 119(a) to Korean Patent Application No. 10-2022-0063836, filed on May 25, 2022, the disclosure of which is incorporated herein by reference in its entirety.

BACKGROUND

1. Field

Various embodiments of the present disclosure relate to a semiconductor design technique, and particularly, to an apparatus for evicting cold data in a volatile memory device.

2. Description of the Related Art

Semiconductor memory devices for storing data may be roughly classified into volatile memory devices and non-volatile memory devices. The volatile memory devices such as dynamic random access memories (DRAMs) that store data by charging or discharging cell capacitors retain data stored therein while power is applied thereto, but lose the data stored therein when power is off. The non-volatile memory devices may store data therein although power is off. The volatile memory devices are mainly used as main memories of computers and the like, and the non-volatile memory devices are used as large-capacity memories that store programs and data in a wide range of application devices such as computers and portable communication devices.

A memory cell of the volatile memory device such as a DRAM is composed of a transistor serving as a switch and a capacitor for storing charges (or data). "High" (logic level 1) and "low" (logic level 0) data are determined according to whether there is any charge in the capacitor in the memory cell, that is, according to whether a terminal voltage of the capacitor is high or low.

Data are stored in a form in which charges are accumulated in a capacitor, and theoretically, there is no power consumption. However, since there may be a leakage current due to such reasons as a PN junction of a transistor, the initial amount of charges stored in the capacitor may disappear, which leads to the loss of data. In order to prevent such an issue from occurring, it is necessary to read data in a memory cell before the data get lost and to recharge the normal amount of charges according to the read information. The data may be retained only when such an operation is repeated periodically, and the process of recharging cell charges is referred to as a refresh operation which will be, hereinafter, referred to as a normal refresh operation.

SUMMARY

Various embodiments of the present disclosure are directed to a volatile memory device that may determine whether there is cold data, according to a refresh count for each row.

Various embodiments of the present disclosure are directed to a memory system and a data processing system, which evict cold data from a volatile memory device and store the evicted cold data in a non-volatile memory device.

These technical problems obtainable from the present disclosure are not limited to those described herein, and other technical problems not described herein will be apparently understood by those skilled in the art, to which the present disclosure pertains, from the following description.

In an aspect of an embodiment of the present disclosure, a memory device may include: a volatile memory cell array coupled to a plurality of word lines; a refresh operation circuit suitable for performing, in response to one of a refresh command and an eviction control signal, a corresponding one of a refresh operation and an eviction operation on a word line selected by a refresh address among the word lines; and a table management circuit suitable for: counting, as a counting number of each of a plurality of row addresses, a number of times that each of the row addresses corresponding to the word lines is used for the refresh operation, selecting, as a selected row addresses, one or more among the row addresses on the basis of the counting number, storing the selected row addresses in a refresh table, and controlling whether to enable the eviction control signal on the basis of a row address having the counting number exceeding a reference number among the selected row addresses stored in the refresh table.

In an aspect of an embodiment of the present disclosure, a memory system may include: a non-volatile memory device; a volatile memory device suitable for defining, as cold data, data stored in a word line, on which a refresh operation is performed a number of times greater than a reference number among a plurality of word lines coupled to a volatile memory cell array, and evicting the cold data; and a controller suitable for controlling operations of the volatile memory device and the non-volatile memory device, and storing the evicted cold data into the non-volatile memory device.

In an aspect of an embodiment of the present disclosure, a data processing system may include: a memory system including a non-volatile memory device; and a host including a volatile memory device suitable for defining, as cold data, data stored in a word line, on which a refresh operation is performed a number of times greater than a reference number among a plurality of word lines coupled to a volatile memory cell array, and evicting the cold data; and a processor suitable for storing the evicted cold data into the non-volatile memory device.

In an aspect of an embodiment of the present disclosure, an operating method of a memory device including rows of volatile memory cells, the operating method may include: listing addresses of rows among the rows; increasing a count of a refresh address when the refresh address hits the list while setting the count to a default value lower than a threshold when the refresh address misses the list; providing, when the count becomes greater than the threshold, a storage device with data from the row of the refresh address while removing the refresh address from the list; inserting, when the refresh address misses the list having a vacant node, the refresh address into the vacant node while replacing, when the refresh address misses the list full of the addresses, a victim address with the refresh address within the list, the count of the victim address being the default value; and removing a column operation address from the list when the column operation address hits the list. A refresh operation may be no longer performed on the row of the moved data.

BRIEF DESCRIPTION OF THE DRAWINGS

FIGS. 6 to 10 are diagrams for describing a management operation of a refresh table in the semiconductor memory device in accordance with an embodiment of the present disclosure.

DETAILED DESCRIPTION

Figure 1:
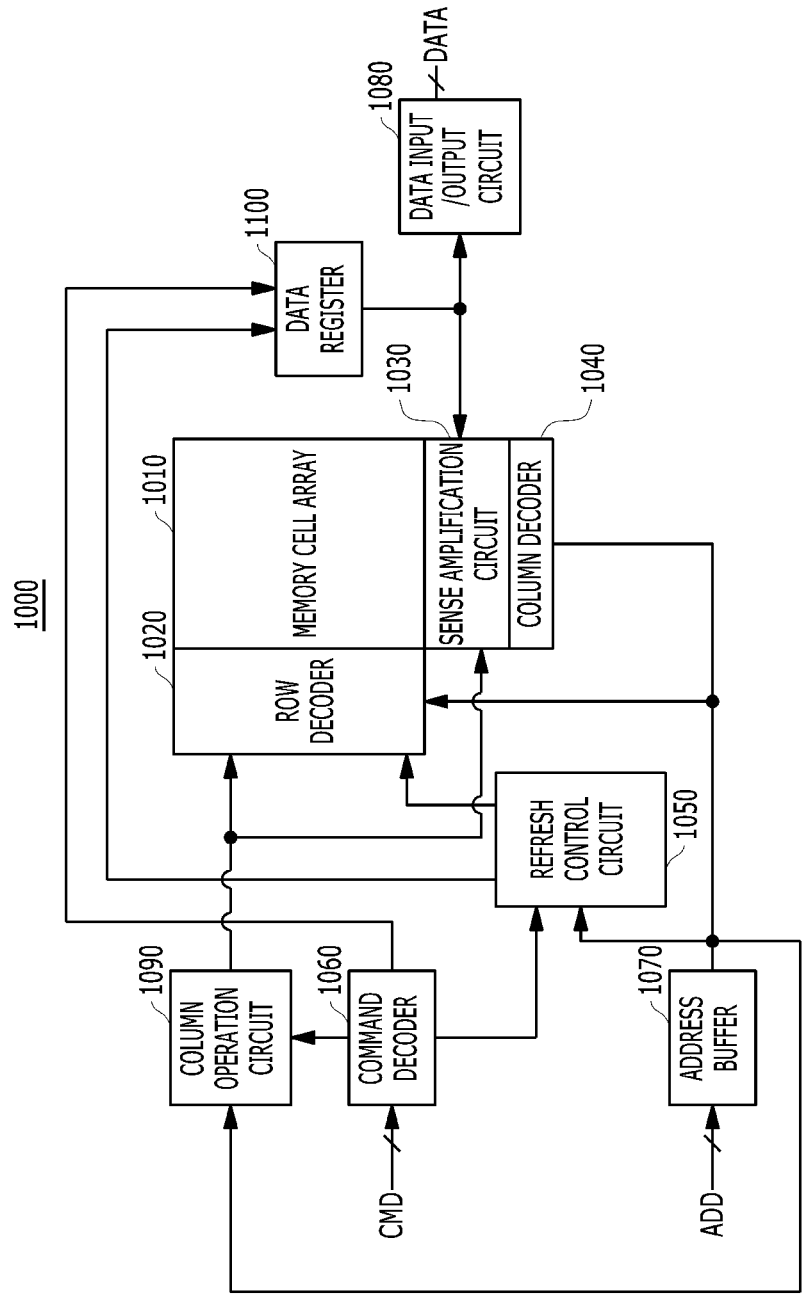
FIG. 1 is a block diagram schematically illustrating a structure of a semiconductor memory device in accordance with an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits.

According to an embodiment, the data item may include a discrete object. According to another embodiment, the data item may include a unit of information within a transmission packet between two different components.

FIG. 1 is a block diagram schematically illustrating a structure of a semiconductor memory device 1000 in accordance with an embodiment of the present disclosure. Herein, a case in which the semiconductor memory device 1000 is a DRAM memory device having volatility characteristics is described as an example.

Referring to FIG. 1, the semiconductor memory device 1000 may include a memory cell array 1010, a row decoder 1020, a sense amplification circuit 1030, a column decoder 1040, a refresh control circuit 1050, a command decoder 1060, an address buffer 1070, a data input/output circuit 1080, a column operation circuit 1090, and a data register 1100.

The memory cell array 1010 may be a data storage in which a plurality of memory cells are connected between a plurality of word lines arranged in a row direction and a plurality of bit lines arranged in a column direction. The memory cell array 1010 may include a plurality of DRAM memory cells, and since the DRAM memory cells have volatile characteristics, data stored in the DRAM memory cells may be lost when power is turned off. In the following description, the memory cell array 1010 is referred to as a "volatile memory region 1010."

The address buffer 1070 may temporarily store an address signal ADD inputted from an external device. The address signal ADD buffered in the address buffer 1070 may be used to designate a memory cell which data is to be written to or read from.

The row decoder 1020 may decode a row address, which is outputted from the refresh control circuit 1050 or the address buffer 1070, to designate one of the plurality of word lines included in the volatile memory region 1010. That is, the row decoder 1020 may decode a row address of the address signal ADD outputted from the address buffer 1070, and enable a word line connected to the memory cell which data is to be written to or read from, during a write or read operation. In addition, the row decoder 1020 may refresh a corresponding row on the basis of a row address generated by the refresh control circuit 1050.

The column decoder 1040 may decode a column address of the address signal ADD, which is outputted from the address buffer 1070, to designate a bit line connected to a memory cell which data is to be inputted to or outputted from.

The sense amplification circuit 1030 may sense and amplify data of the memory cell connected to the word line designated by the row decoder 1020 and the bit line designated by the column decoder 1040, and store amplified data in the corresponding memory cell.

The data input/output circuit 1080 may output data from or input data to the memory cell of the volatile memory region 1010 designated by the address signal ADD. Consequently, the data inputted through the data input/output circuit 1080 may be written to the volatile memory region 1010 on the basis of the address signal ADD, or the data read from the volatile memory region 1010 on the basis of the address signal ADD may be outputted to the outside through the data input/output circuit 1080.

The command decoder 1060 may receive a command signal CMD applied from the outside, decode the command signal CMD, and generate a decoded internal command, for example, a column operation command, a refresh command, and a data movement command.

The refresh control circuit 1050 may control a refresh operation on the plurality of word lines included in the volatile memory region 1010, in response to the refresh command generated by the command decoder 1060. In addition, the refresh control circuit 1050 may control an eviction operation for evicting data of a word line, which is selected as an eviction target among the plurality of word lines included in the volatile memory region 1010, to the outside of the volatile memory region 1010 according to an eviction control condition determined on the basis of the refresh operation. For reference, detailed descriptions of the eviction control condition may be made with reference to FIGS. 2 to 4 below, and the data of the word line selected as the eviction target may be defined as cold data.

The data register 1100 may temporarily store the cold data outputted from the volatile memory region 1010 when the refresh control circuit 1050 performs the eviction operation. That is, the data register 1100 may temporarily store the cold data outputted from the volatile memory region 1010 under the control of the refresh control circuit 1050. In addition, the data register 1100 may output the cold data stored therein to the outside of the semiconductor memory device 1000 through the data input/output circuit 1080 in response to the data movement command generated by the command decoder 1060.

The column operation circuit 1090 may control a column operation on the plurality of memory cells included in the volatile memory region 1010, in response to the column operation command generated by the command decoder 1060. The column operation may include active and precharge operations for activating and precharging the plurality of word lines included in the volatile memory region 1010, a write operation for writing data to a memory cell connected to the activated word line, and a read operation for reading data from the memory cell connected to the activated word line. The column operation command may include active and precharge commands corresponding to the active and precharge operations, respectively, a write command corresponding to the write operation, and a read command corresponding to the read operation.

Figure 2:
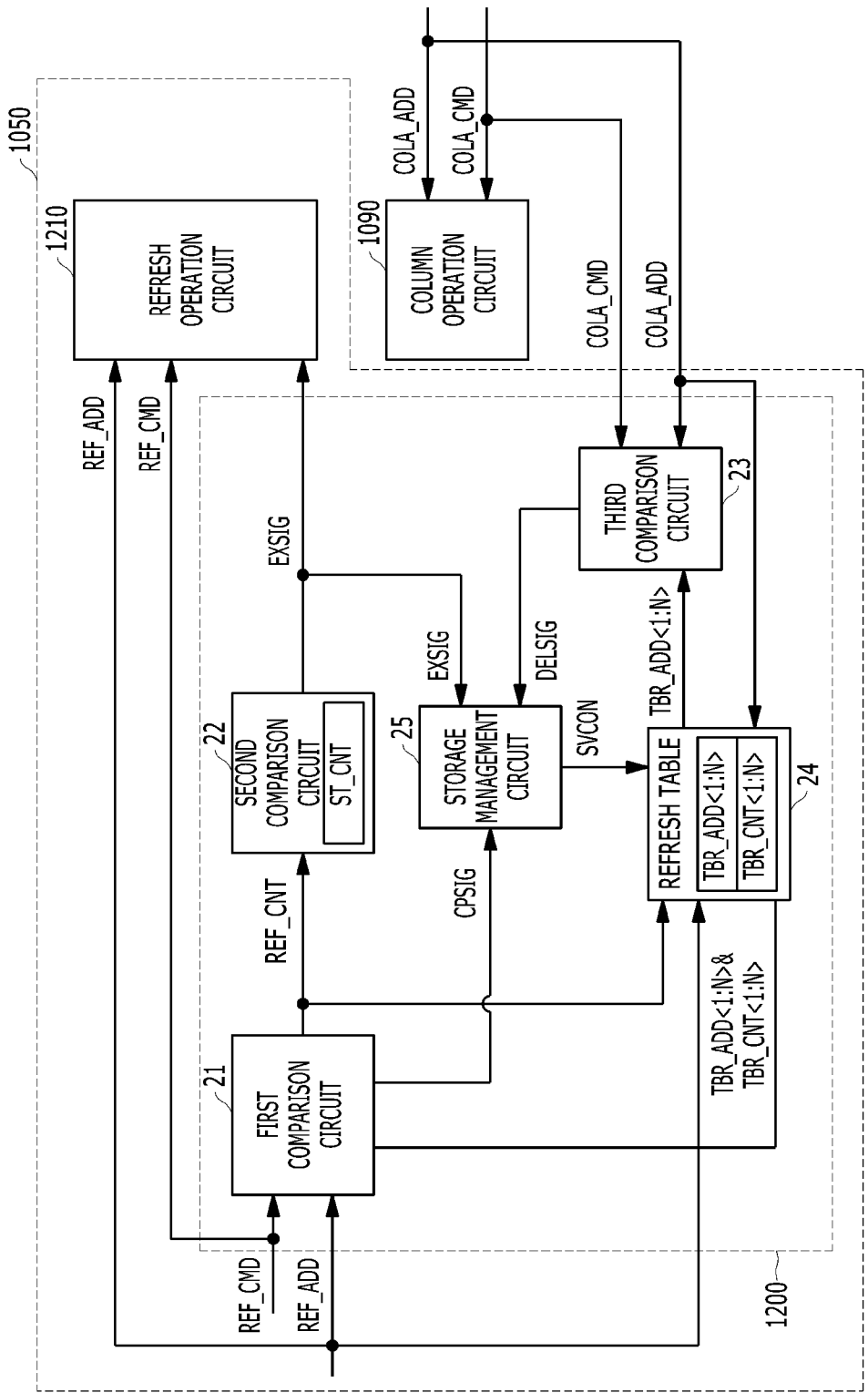
FIG. 2 is a block diagram schematically illustrating a structure of a refresh control circuit among components of the semiconductor memory device illustrated in FIG. 1 in accordance with an embodiment of the present disclosure.

FIG. 2 is a block diagram schematically illustrating a structure of the refresh control circuit 1050 among components of the semiconductor memory device 1000 illustrated in FIG. 1 in accordance with an embodiment of the present disclosure.

Referring to FIG. 2, the refresh control circuit 1050 may include a table management circuit 1200 and a refresh operation circuit 1210.

The table management circuit 1200 may include a first comparison circuit 21, a second comparison circuit 22, a third comparison circuit 23, a refresh table 24, and a storage management circuit 25.

In the following description, K word lines are included in the volatile memory region 1010 described above with reference to FIG. 1. Accordingly, row addresses having K values for respectively selecting the K word lines included in the volatile memory region 1010 may be present. In this case, "K" may be a natural number equal to or greater than 2. According to an embodiment, "K" may be 1024.

Specifically, the refresh operation circuit 1210 may perform one of the refresh operation and the eviction operation on a word line selected by a refresh address REF_ADD among the K word lines in response to a refresh command REF_CMD and an eviction control signal EXSIG. For reference, the refresh address REF_ADD may refer to an address used for the refresh operation among the row addresses having K values. Accordingly, the refresh address REF_ADD may also have K values.

Although not shown in the drawing, the refresh control circuit 1050 may further include a 'refresh address generation circuit' for generating the refresh address REF_ADD. According to an embodiment, the refresh address generation circuit checks whether each of the K word lines is valid stated or invalid state, selectively generates the refresh address REF_ADD corresponding to word line of valid state according to the check result, and output to the refresh operation circuit 1210 and the table management circuit 1200. According to an embodiment, the refresh address generation circuit may recognize a word line in which a data of a predetermined value is stored among the K word lines as invalid state. Here, the predetermined value may mean zero. According to an embodiment, the refresh address generation circuit may check whether each of the K word lines is valid state or invalid state by using a bitmap corresponding to each of the K word lines.

The table management circuit 1200 may count the number of times that each of the K row addresses is used for the refresh operation, select maximum N row addresses TBR_ADD<1:N> having a relatively high counting number, and store the selected N row addresses TBR_ADD<1:N> in the refresh table 24. In addition, the table management circuit 1200 may control whether to enable the eviction control signal EXSIG, according to whether a row address having a counting number exceeding a reference number ST_CNT is included in the maximum N row addresses TBR_ADD<1:N> stored in the refresh table 24. In this case, "N" may be a natural number equal to or greater than 1 and equal to or smaller than "K". According to an embodiment, "N" may be 5.

The first comparison circuit 21 may compare the refresh address REF_ADD with each of the maximum N row addresses TBR_ADD<1:N> stored in the refresh table 24, in response to the refresh command REF_CMD, and determine a counting number REF_CNT of the refresh address REF_ADD on the basis of the comparison result.

Specifically, when a row address having the same value as the refresh address REF_ADD is included in the maximum N row addresses TBR_ADD<1:N> stored in the refresh table 24, the first comparison circuit 21 may up-count a counting number of the corresponding row address, determine the up-counted counting number as the counting number REF_CNT of the refresh address REF_ADD, and enable a comparison signal CPSIG. In this case, the corresponding row address may refer to the row address having the same value as the refresh address REF_ADD among the maximum N row addresses TBR_ADD<1:N> stored in the refresh table 24.

In addition, when the row address having the same value as the refresh address REF_ADD is not included in the maximum N row addresses TBR_ADD<1:N> stored in the refresh table 24, the first comparison circuit 21 may determine the counting number REF_CNT of the refresh address REF_ADD as a predetermined number smaller than the reference number ST_CNT, and disable the comparison signal CPSIG.

The second comparison circuit 22 may compare the counting number REF_CNT of the refresh address REF_ADD determined by the first comparison circuit 21 with the reference number ST_CNT, and selectively enable the eviction control signal EXSIG according to the comparison result.

Specifically, the second comparison circuit 22 may enable the eviction control signal EXSIG when the counting number REF_CNT of the refresh address REF_ADD determined by the first comparison circuit 21 exceeds the reference number ST_CNT. In addition, the second comparison circuit 22 may disable the eviction control signal EXSIG when the counting number REF_CNT of the refresh address REF_ADD determined by the first comparison circuit 21 is less than or equal to the reference number ST_CNT.

The third comparison circuit 23 may compare a column operation address COLA_ADD with each of the maximum N row addresses TBR_ADD<1:N> stored in the refresh table 24, in response to a column operation command COLA_CMD.

Specifically, when a row address having the same value as the column operation address COLA_ADD is included in the maximum N row addresses TBR_ADD<1:N> stored in the refresh table 24, the third comparison circuit 23 may enable a deletion signal DELSIG.

In addition, when the row address having the same value as the column operation address COLA_ADD is not included in the maximum N row addresses TBR_ADD<1:N> stored in the refresh table 24, the third comparison circuit 23 may disable the deletion signal DELSIG.

The storage management circuit 25 may manage only the maximum N row addresses TBR_ADD<1:N> having a relatively high counting number among the K row addresses in the refresh table 24 while the counting number is less than or equal to the reference number ST_CNT, to be stored in response to the operation result CPSIG of the first comparison circuit 21 and the operation result EXSIG of the second comparison circuit 22.

Specifically, when the eviction control signal EXSIG outputted from the second comparison circuit 22 is in an enabled state, the storage management circuit 25 may delete, from the refresh table 24, the row address having the same value as the refresh address REF_ADD among the maximum N row addresses TBR_ADD<1:N> stored in the refresh table 24.

In addition, when the eviction control signal EXSIG outputted from the second comparison circuit 22 is in a disabled state and the comparison signal CPSIG outputted from the first comparison circuit 21 is in an enabled state, the storage management circuit 25 may update the counting number of the row address having the same value as the refresh address REF_ADD, among the maximum N row addresses TBR_ADD<1:N> stored in the refresh table 24, to the counting number REF_CNT of the refresh address REF_ADD determined by the first comparison circuit 21.

Moreover, when the eviction control signal EXSIG outputted from the second comparison circuit 22 and the comparison signal CPSIG outputted from the first comparison circuit 21 are in the disabled states, the storage management circuit 25 may selectively store, in the refresh table 24, the refresh address REF_ADD whose counting number is determined as the predetermined number by the first comparison circuit 21. According to an embodiment, the predetermined number may be "1".

More specifically, when the eviction control signal EXSIG outputted from the second comparison circuit 22 and the comparison signal CPSIG outputted from the first comparison circuit 21 are in the disabled states, the storage management circuit 25 may store the refresh address REF_ADD whose counting number is determined as the predetermined number by the first comparison circuit 21, in an empty space, if any, of the refresh table 24.

Under the circumstance that the eviction control signal EXSIG outputted from the second comparison circuit 22 and the comparison signal CPSIG outputted from the first comparison circuit 21 are in the disabled states, when an empty space is not present in the refresh table 24 and one or more row addresses each having the counting number determined as the predetermined number are included in the maximum N row addresses TBR_ADD<1:N> stored in the refresh table 24, the storage management circuit 25 may replace a corresponding row address and store the refresh address REF_ADD whose counting number is determined as the predetermined number by the first comparison circuit 21. In this case, the corresponding row address may refer to any of the one or more row addresses each having the predetermined number stored in the refresh table 24.

Under the circumstance that the eviction control signal EXSIG outputted from the second comparison circuit 22 and the comparison signal CPSIG outputted from the first comparison circuit 21 are in the disabled states, when an empty space is not present in the refresh table 24 and each of the counting numbers of the maximum N row addresses TBR_ADD<1:N> stored in the refresh table 24 does not exceed the predetermined number, the storage management circuit 25 may not store, in the refresh table 24, the refresh address REF_ADD whose counting number is determined as the predetermined number by the first comparison circuit 21.

The storage management circuit 25 may delete, from the refresh table 24, the row address having the same value as the column operation address COLA_ADD among the maximum N row addresses TBR_ADD<1:N> stored in the refresh table 24, in response to the operation result DELSIG of the third comparison circuit 23, that is, the deletion signal DELSIG outputted from the third comparison circuit 23 being enabled.

The column operation circuit 1090 described with reference to FIG. 1 may control the column operation on the plurality of memory cells included in the word line selected by the column operation address COLA_ADD among the K word lines included in the volatile memory region 1010, in response to the column operation command generated by the command decoder 1060. In this case, the column operation address COLA_ADD may refer to an address used for the column operation among the row addresses having K values.

Accordingly, the column operation address COLA_ADD may also have K values. Herein, the column operation may include active and precharge operations for activating and precharging the plurality of word lines included in the volatile memory region 1010, a write operation for writing data to a memory cell connected to the activated word line, and a read operation for reading data from the memory cell connected to the activated word line. The column operation command may include active and precharge commands corresponding to the active and precharge operations, respectively, a write command corresponding to the write operation, and a read command corresponding to the read operation.

Moreover, the storage management circuit 25 may control an operation of the refresh table 24 by appropriately adjusting a value of a storage control signal SVCON and transmitting an adjusted value to the refresh table 24.

According to an embodiment, since the first comparison circuit 21 sequentially compares the refresh address REF_ADD with each of the maximum N row addresses TBR_ADD<1:N> stored in the refresh table 24, the storage management circuit 25 may set a value of the storage control signal SVCON to a value for performing a deletion operation, in response to the comparison signal CPSIG being enabled and the eviction control signal EXSIG being enabled, and transmit the set value to the refresh table 24, and then the refresh table 24 may delete the row address, transmitted to the first comparison circuit 21, from the maximum N row addresses TBR_ADD<1:N> stored therein.

According to another embodiment, since the first comparison circuit 21 sequentially compares the refresh address REF_ADD with each of the maximum N row addresses TBR_ADD<1:N> stored in the refresh table 24, the storage management circuit 25 may set a value of the storage control signal SVCON to a value for performing an updating operation, in response to the comparison signal CPSIG being enabled and the eviction control signal EXSIG being disabled, and transmit the set value to the refresh table 24, and then the refresh table 24 may update the counting number of the row address, transmitted to the first comparison circuit 21 among the maximum N row addresses TBR_ADD<1:N> stored therein, to the counting number REF_CNT transmitted to the first comparison circuit 21.

According to still another embodiment, since the first comparison circuit 21 sequentially compares the refresh address REF_ADD with each of the maximum N row addresses TBR_ADD<1:N> stored in the refresh table 24, the storage management circuit 25 may set a value of the storage control signal SVCON to a value for performing a new storage operation, in response to the comparison signal CPSIG and the eviction control signal EXSIG being both disabled, and transmit the set value to the refresh table 24, and then the refresh table 24 may perform an operation of checking whether an empty space is present therein and an operation of comparing each of N counting numbers TBR_CNT<1:N> with a predetermined number, and store the refresh address REF_ADD and the predetermined number in the empty space, store the refresh address REF_ADD by replacing a row address having the predetermined number, or not store the refresh address REF_ADD.

According to yet another embodiment, since the third comparison circuit 23 sequentially compares the column operation address COLA_ADD with each of the maximum N row addresses TBR_ADD<1:N> stored in the refresh table 24, the storage management circuit 25 may set a value of the storage control signal SVCON to a value for performing the deletion operation, in response to the deletion signal DELSIGN being enabled, and transmit the set value to the refresh table 24, and then the refresh table 24 may delete the row address transmitted to the third comparison circuit 23 from the maximum N row addresses TBR_ADD<1:N> stored therein.

While a word line selected by the refresh address REF_ADD among the K word lines is activated in response to the refresh command REF_CMD, the refresh operation circuit 1210 may move data stored in the selected word line to the outside of the volatile memory region 1010 in response to the eviction control signal EXSIG being enabled, and then perform an operation of initializing the selected word line, as the eviction operation. That is, the refresh operation circuit 1210 may store the data, stored in the selected word line, in the data register 1100 (refer to FIG. 1) through the eviction operation. In this case, the operation of initializing the selected word line may be an operation in which the data stored in the selected word line may be invalid state by initialized to the predetermined value. The refresh address REF_ADD may not be generated for the selected word line that is in invalid state and therefore the refresh operation may not be performed.

When the refresh operation circuit 1210 performs the eviction operation, the data register 1100 may temporarily store, as cold data, the data outputted from the selected word line of the volatile memory region 1010. In addition, the data register 1100 may output the cold data stored therein to the outside of the semiconductor memory device 1000 through the data input/output circuit 1080 (refer to FIG. 1) in response to the data movement command generated by the command decoder 1060.

For reference, the components 21, 22, 23, 24 and 25 included in the table management circuit 1200 may be included in the form of a hardware module as illustrated in the drawing, but unlike what is illustrated in the drawing, the components 21, 22, 23, 24 and 25 may operate in the form of firmware.

According to an embodiment, the table management circuit 1200 may include a register for storing the refresh table 24 and a processor for controlling an operation of the register, in the form of hardware. In this case, firmware may be loaded into the processor included in the refresh table 24, and the operations of the first comparison circuit 21, the second comparison circuit 22, the third comparison circuit 23 and the storage management circuit 25 may be performed.

Figure 3:
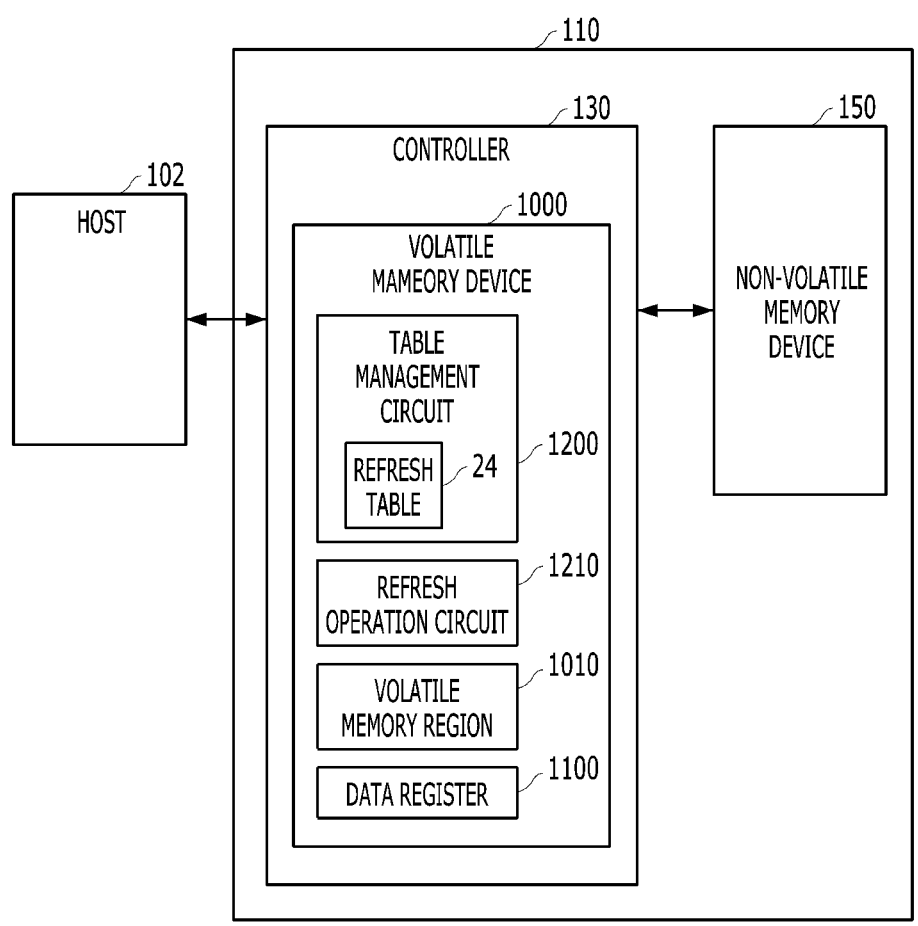
FIG. 3 is a block diagram schematically illustrating a structure of a memory system including the semiconductor memory device illustrated in FIGS. 1 and 2 in accordance with an embodiment of the present disclosure.

FIG. 3 is a block diagram schematically illustrating a structure of a memory system 110 including the semiconductor memory device 1000 illustrated in FIGS. 1 and 2 in accordance with an embodiment of the present disclosure.

Herein, in the embodiment of FIG. 3 as an example, the semiconductor memory device 1000 shown in FIGS. 1 and 2 is the volatile memory device. Therefore, in the following description, the 'volatile memory device' is given with the same reference numeral as the reference numeral of the semiconductor memory device 1000 shown in FIGS. 1 and 2.

Referring to FIG. 3, the structure of the volatile memory device 1000 included in the memory system 110 may be based on the structure of the volatile memory device 1000 described above with reference to FIGS. 1 and 2. That is, the operation of the volatile memory device 1000 included in the memory system 110 may perform based on the operation of the volatile memory device 1000 described above with reference to FIGS. 1 and 2.

The memory system 110 may include the volatile memory device 1000, a non-volatile memory device 150, and a controller 130. The volatile memory device 1000 may be located inside the controller 130 as illustrated in the drawing, but may be located outside the controller 130 similarly to the non-volatile memory device 150 unlike what is illustrated in the drawing.

The memory system 110 may operate in response to a request from a host 102, and particularly, store data to be accessed by the host 102. In other words, the memory system 110 may be used as a main memory device or an auxiliary memory device of the host 102.

The memory system 110 may be implemented as any of various types of storage devices according to a protocol of a host interface coupled with the host 102. For example, the memory system 110 may be implemented as any one of various storage devices, such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card and a memory stick.

The non-volatile memory device 150 included in the memory system 110 may be implemented as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magnetic RAM (MRAM), a resistive RAM (RRAM) or a flash memory.

The volatile memory device 1000 included in the memory system 110 may be implemented as a dynamic random access memory (DRAM) or a static RAM (SRAM).

The controller 130 included in the memory system 110 may control operations of the volatile memory device 1000 and the non-volatile memory device 150 in response to a request from the host 102. For example, the controller 130 may provide the host 102 with data read from the volatile memory device 1000 or the non-volatile memory device 150, and store data received from the host 102 in the volatile memory device 1000 or the non-volatile memory device 150.

Specifically, the volatile memory device 1000 may regard data, which is stored in a word line whose number of times used for the refresh operation exceeds a reference number among the plurality of word lines included in the volatile memory region 1010, as cold data, and evict the cold data.

The controller 130 may move and store the cold data evicted by the volatile memory device 1000 into the non-volatile memory device 150.

More specifically, the volatile memory device 1000 may include the volatile memory region 1010, the refresh operation circuit 1210, the table management circuit 1200, and the data register 1100 as described above with reference to FIGS. 1 and 2. The table management circuit 1200 may include the refresh table 24.

Herein, the volatile memory region 1010 includes K word lines. Accordingly, row addresses having K values for respectively selecting the K word lines included in the volatile memory region 1010 may be present. In this case, "K" may be a natural number equal to or greater than 2. According to an embodiment, "K" may be 1024.

Although not shown in the drawing, the volatile memory device 1000 may further include a 'refresh address generation circuit' for generating the refresh address REF_ADD. According to an embodiment, the refresh address generation circuit checks whether each of the K word lines is valid stated or invalid state, selectively generates the refresh address REF_ADD corresponding to word line of valid state according to the check result, and output to the refresh operation circuit 1210 and the table management circuit 1200. According to an embodiment, the refresh address generation circuit may recognize a word line in which a data of a predetermined value is stored among the K word lines as invalid state. Here, the predetermined value may mean zero. According to an embodiment, the refresh address generation circuit may check whether each of the K word lines is valid state or invalid state by using a bitmap corresponding to each of the K word lines.

The refresh operation circuit 1210 may perform one of the refresh operation and the eviction operation on the word line selected by the refresh address REF_ADD among the K word lines, in response to the refresh command REF_CMD and the eviction control signal EXSIG. For reference, the refresh address REF_ADD may refer to an address used for the refresh operation among the row addresses having K values. Accordingly, the refresh address REF_ADD may also have K values.

According to an embodiment, the refresh operation circuit 1210 may perform the eviction operation on the word line selected by the refresh address REF_ADD, in response to the refresh command REF_CMD and the enabled eviction control signal EXSIG. In addition, the refresh operation circuit 1210 may perform the refresh operation on the word line selected by the refresh address REF_ADD, in response to the refresh command REF_CMD and the disabled eviction control signal EXSIG.

The table management circuit 1200 may count the number of times that each of the K row addresses is used for the refresh operation, select the maximum N row addresses TBR_ADD<1:N> having a relatively high counting number, and store the selected N row addresses TBR_ADD<1:N> in the refresh table 24. In addition, the table management circuit 1200 may control whether to enable the eviction control signal EXSIG, according to whether a row address having a counting number exceeding the reference number ST_CNT is included in the maximum N row addresses TBR_ADD<1:N> stored in the refresh table 24. In this case, "N" may be a natural number equal to or greater than 1 and equal to or smaller than "K". According to an embodiment, "N" may be 5.

According to an embodiment, when the refresh address REF_ADD is included in the maximum N row addresses TBR_ADD<1:N> stored in the refresh table 24, and the counting number of the refresh address REF_ADD exceeds the reference number ST_CNT, the table management circuit 1200 may enable the eviction control signal EXSIG.

According to an embodiment, when the refresh address REF_ADD is not included in the maximum N row addresses TBR_ADD<1:N> stored in the refresh table 24, the table management circuit 1200 may disable the eviction control signal EXSIG.

According to an embodiment, when the refresh address REF_ADD is included in the maximum N row addresses TBR_ADD<1:N> stored in the refresh table 24, and the counting number of the refresh address REF_ADD is less than or equal to the reference number ST_CNT, the table management circuit 1200 may disable the eviction control signal EXSIG.

While a word line selected by the refresh address REF_ADD among the K word lines is activated in response to the refresh command REF_CMD, the refresh operation circuit 1210 may regard data stored in the selected word line as the cold data, move the data to the outside of the volatile memory region 1010, in response to the eviction control signal EXSIG being enabled, and then perform an operation of initializing the selected word line, as the eviction operation. That is, the refresh operation circuit 1210 may store the cold data, stored in the selected word line, in the data register 1100 through the eviction operation. In this case, the operation of initializing the selected word line may be an operation in which the data stored in the selected word line may be invalid state by initialized to the predetermined value. The refresh address REF_ADD may not be generated for the selected word line that is in invalid state and therefore the refresh operation may not be performed.

When the refresh operation circuit 1210 performs the eviction operation, the data register 1100 may temporarily store the cold data outputted from the volatile memory region 1010. In addition, the data register 1100 may output the data stored therein to the outside of the volatile memory device 1000 in response to the data movement command applied from the outside of the volatile memory device 1000.

The controller 130 may generate the data movement command, transmit the data movement command to the volatile memory device 1000, and then store the cold data, which is outputted from the data register 1100 of the volatile memory device 1000 in response to the data movement command, in the non-volatile memory device 150.

Figure 4:
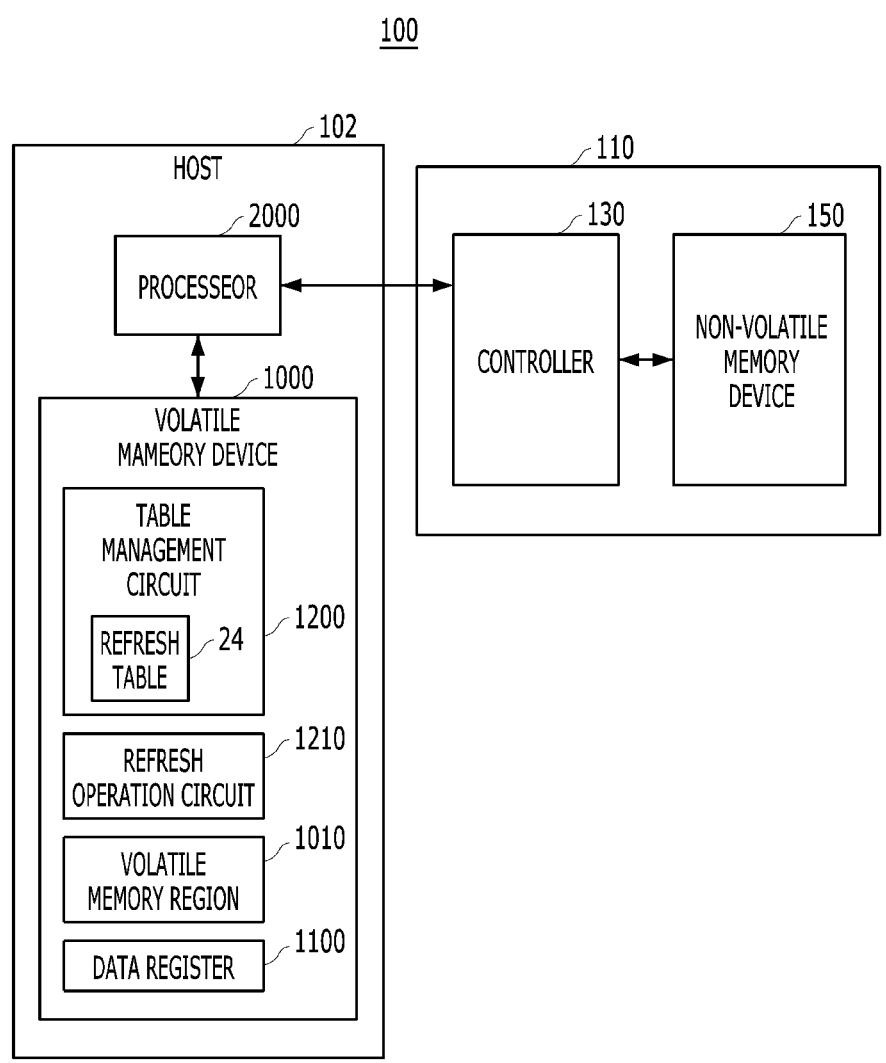
FIG. 4 is a block diagram schematically illustrating a structure of a data processing system including the semiconductor memory device illustrated in FIGS. 1 and 2 in accordance with an embodiment of the present disclosure.

FIG. 4 is a block diagram schematically illustrating a structure of a data processing system 100 including the semiconductor memory device 1000 illustrated in FIGS. 1 and 2 in accordance with an embodiment of the present disclosure.

Herein, in the embodiment of FIG. 4 the semiconductor memory device 1000 shown in FIGS. 1 and 2 is the volatile memory device. Therefore, in the following description, the 'volatile memory device' is given with the same reference numeral as the reference numeral of the semiconductor memory device 1000 shown in FIGS. 1 and 2.

Referring to FIG. 4, the structure of the volatile memory device 1000 included in the host 102 may be based on the structure of the volatile memory device 1000 described above with reference to FIGS. 1 and 2. That is, the operation of the volatile memory device 1000 included in the host 102 may perform based on the operation of the volatile memory device 1000 described above with reference to FIGS. 1 and 2.

The data processing system 100 may include a host 102 and a memory system 110. The host 102 may include a volatile memory device 1000 and a processor 2000. The memory system 110 may include a controller 130 and a non-volatile memory device 150.

Examples of the host 102 may include a portable electronic device such as a mobile phone, an MP3 player and a laptop computer, or an electronic device such as a desktop computer, a game player, a television (TV) and a projector, that is, wired and wireless electronic devices.

The host 102 may include at least one operating system (OS), which generally manages and controls functions and operations of the host 102, and provides a mutual operation between the host 102 and a user using the data processing system 100 or the memory system 110. The OS may support functions and operations corresponding to the use, purpose, and usage of a user. For example, the OS may be divided into a general OS or a mobile OS, depending on the mobility of the host 102. The general OS may be divided into a personal OS or an enterprise OS, depending on the user's usage environment. Examples of the personal OS configured to support a function of providing a service to general users may include Windows and Chrome, and examples of the enterprise OS configured to secure and support high performance may include Windows server, Linux and Unix. Further, examples of the mobile OS configured to support a function of providing a mobile service to users and a power saving function of a system may include Android, iOS and Windows Mobile. The host 102 may include a plurality of OSs, and execute an OS to perform an operation corresponding to a user request on the memory system 110. The host 102 transmits a plurality of commands corresponding to the user requests to the memory system 110, and accordingly, the memory system 110 performs operations corresponding to the commands, that is, operations corresponding to the user requests.

The volatile memory device 1000 included in the host 102 may operate under the control of the processor 2000, and store data used during the operation of the host 102. That is, the volatile memory device 1000 included in the host 102 may be used as a main memory device of the host 102.

The volatile memory device 1000 included in the host 102 may be implemented as a dynamic random access memory (DRAM) or a static RAM (SRAM).

The memory system 110 may operate in response to a request from the host 102, and particularly, store data to be accessed by the host 102. The memory system 110 may be used as a device for storing data of the host 102. The memory system 110 may be implemented as any of various types of storage devices according to a protocol of a host interface coupled with the host 102. For example, the memory system 110 may be implemented as any of various storage devices, such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card and a memory stick.

The non-volatile memory device 150 included in the memory system 110 may be implemented as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magnetic RAM (MRAM), a resistive RAM (RRAM) or a flash memory.

The controller 130 included in the memory system 110 may control an operation of the non-volatile memory device 150 in response to a request from the host 102. For example, the controller 130 may provide the host 102 with data read from the non-volatile memory device 150, and store data received from the host 102 in the non-volatile memory device 150.

Specifically, the volatile memory device 1000 may regard data, which is stored in a word line whose number of times used for the refresh operation exceeds a reference number among the plurality of word lines included in the volatile memory region 1010, as cold data, and evict the cold data.

The processor 2000 may move and store the cold data evicted by the volatile memory device 1000 into the non-volatile memory device 150 included in the memory system 110.

More specifically, the volatile memory device 1000 may include the volatile memory region 1010, the refresh operation circuit 1210, the table management circuit 1200, and the data register 1100 as described above with reference to FIGS. 1 and 2. The table management circuit 1200 may include the refresh table 24.

Herein, the volatile memory region 1010 includes K word lines. Accordingly, row addresses having K values for respectively selecting the K word lines included in the volatile memory region 1010 may be present. In this case, "K" may be a natural number equal to or greater than 2. According to an embodiment, "K" may be 1024.

The refresh operation circuit 1210 may perform one of the refresh operation and the eviction operation on the word line selected by the refresh address REF_ADD among the K word lines, in response to the refresh command REF_CMD and the eviction control signal EXSIG. For reference, the refresh address REF_ADD may refer to an address used for the refresh operation among the row addresses having K values. Accordingly, the refresh address REF_ADD may also have K values.

Although not shown in the drawing, the volatile memory device 1000 may further include a 'refresh address generation circuit' for generating the refresh address REF_ADD. According to an embodiment, the refresh address generation circuit checks whether each of the K word lines is valid stated or invalid state, selectively generates the refresh address REF_ADD corresponding to word line of valid state according to the check result, and output to the refresh operation circuit 1210 and the table management circuit 1200. According to an embodiment, the refresh address generation circuit may recognize a word line in which a data of a predetermined value is stored among the K word lines as invalid state. Here, the predetermined value may mean zero. According to an embodiment, the refresh address generation circuit may check whether each of the K word lines is valid state or invalid state by using a bitmap corresponding to each of the K word lines.

According to an embodiment, the refresh operation circuit 1210 may perform the eviction operation on the word line selected by the refresh address REF_ADD, in response to the refresh command REF_CMD and the enabled eviction control signal EXSIG. In addition, the refresh operation circuit 1210 may perform the refresh operation on the word line selected by the refresh address REF_ADD, in response to the refresh command REF_CMD and the disabled eviction control signal EXSIG.

The table management circuit 1200 may count the number of times that each of the K row addresses is used for the refresh operation, select the maximum N row addresses TBR_ADD<1:N> having a relatively high counting number, and store the selected N row addresses TBR_ADD<1:N> in the refresh table 24. In addition, the table management circuit 1200 may control whether to enable the eviction control signal EXSIG, according to whether a row address having a counting number exceeding the reference number ST_CNT is included in the maximum N row addresses TBR_ADD<1:N> stored in the refresh table 24. In this case, "N" may be a natural number equal to or greater than 1 and equal to or smaller than "K". According to an embodiment, "N" may be 5.

According to an embodiment, when the refresh address REF_ADD is included in the maximum N row addresses TBR_ADD<1:N> stored in the refresh table 24, and the counting number of the refresh address REF_ADD exceeds the reference number ST_CNT, the table management circuit 1200 may enable the eviction control signal EXSIG.

According to an embodiment, when the refresh address REF_ADD is not included in the maximum N row addresses TBR_ADD<1:N> stored in the refresh table 24, the table management circuit 1200 may disable the eviction control signal EXSIG.

According to an embodiment, when the refresh address REF_ADD is included in the maximum N row addresses TBR_ADD<1:N> stored in the refresh table 24, and the counting number of the refresh address REF_ADD is less than or equal to the reference number ST_CNT, the table management circuit 1200 may disable the eviction control signal EXSIG.

While the word line selected by the refresh address REF_ADD among the K word lines is activated in response to the refresh command REF_CMD, the refresh operation circuit 1210 may regard data stored in the selected word line as the cold data, move the data to the outside of the volatile memory region 1010 in response to the eviction control signal EXSIG being enabled, and then perform an operation of initializing the selected word line, as the eviction operation. That is, the refresh operation circuit 1210 may store the cold data, stored in the selected word line, in the data register 1100 through the eviction operation. In this case, the operation of initializing the selected word line may be an operation in which the data stored in the selected word line may be invalid state by initialized to the predetermined value. The refresh address REF_ADD may not be generated for the selected word line that is in invalid state and therefore the refresh operation may not be performed.

When the refresh operation circuit 1210 performs the eviction operation, the data register 1100 may temporarily store the cold data outputted from the volatile memory region 1010. In addition, the data register 1100 may output the data stored therein to the outside of the volatile memory device 1000 in response to the data movement command applied from the outside of the volatile memory device 1000.

The processor 2000 may generate the data movement command, transmit the data move command to the volatile memory device 1000, and then store the cold data, which is outputted from the data register 1100 of the volatile memory device 1000 in response to the data movement command, in the non-volatile memory device 150 included in the memory system 110.

Figure 5:
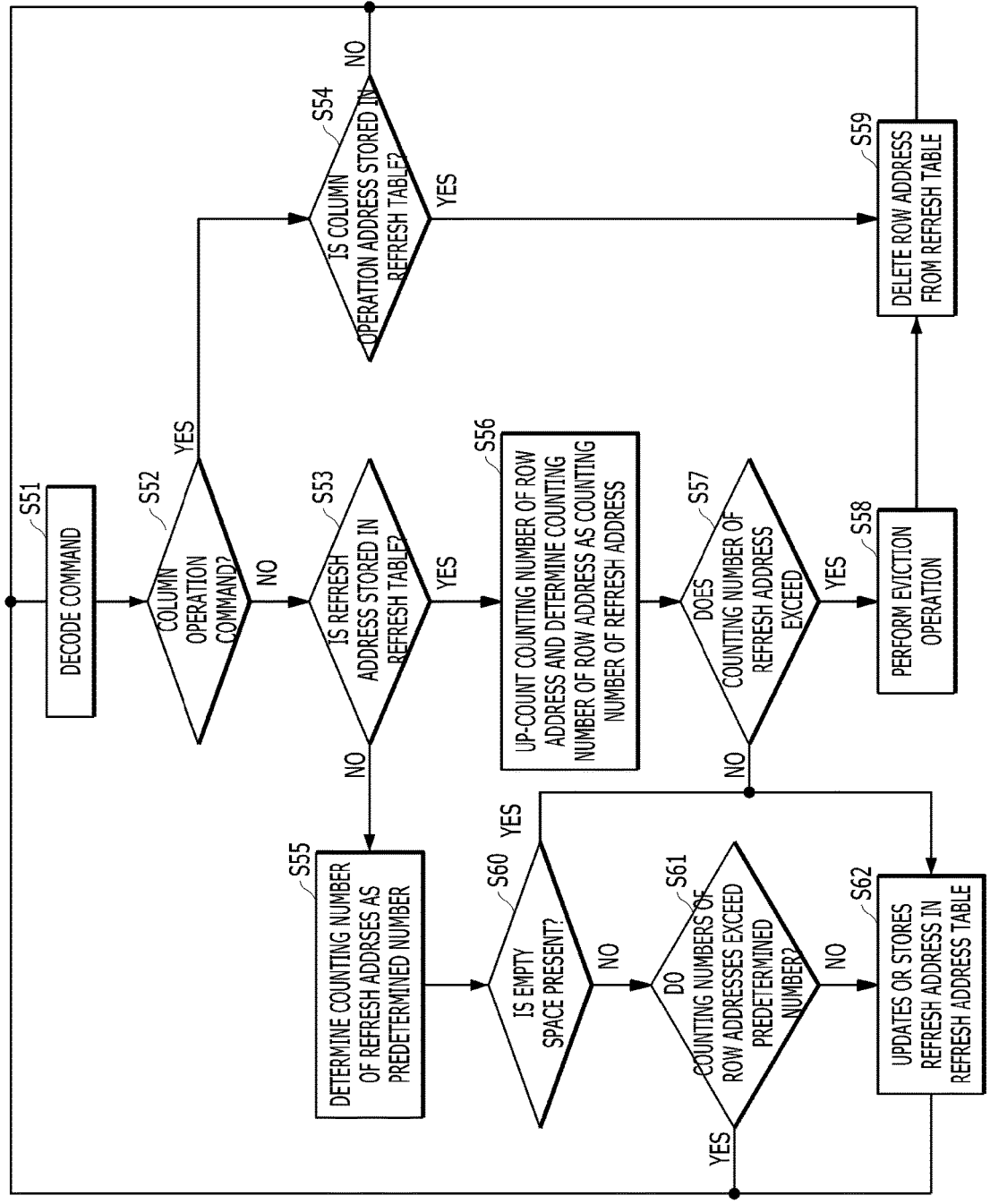
FIG. 5 is a flowchart for describing an operation of the semiconductor memory device in accordance with an embodiment of the present disclosure.

FIG. 5 is a flowchart for describing an operation of the semiconductor memory device 1000 in accordance with an embodiment of the present disclosure.

Referring to FIGS. 1, 2 and 5, the command decoder 1060 may decode a command signal CMD applied from the outside, and generate a decoded internal command, for example, a column operation command, a refresh command and a data movement command, in operation S51.

When the internal command generated in operation S51 is a column operation command COLA_CMD, for example, a read command or a write command (that is, "YES" in operation S52), the table management circuit 1200 may check whether a column operation address COLA_ADD is included in maximum N row addresses TBR_ADD<1:N> stored in the refresh table 24, in operation S54.

When the column operation address COLA_ADD is included in the maximum N row addresses TBR_ADD<1:N> stored in the refresh table 24 (that is, "YES" in operation S54), a row address having the same value as the column operation address COLA_ADD among the maximum N row addresses TBR_ADD<1:N> stored in the refresh table 24 may be deleted from the refresh table 24 in operation S59.

When the column operation address COLA_ADD is not included in the maximum N row addresses TBR_ADD<1:N> stored in the refresh table 24 (that is "NO" in operation S54), the table management circuit 1200 may perform an operation corresponding to the column operation command COLA_CMD, and then wait for a new command signal CMD to be applied from the outside.

When the internal command generated in operation S51 is the refresh command (that is, "NO" in operation S52), the table management circuit 1200 may check whether a refresh address REF_ADD is included in the maximum N row addresses TBR_ADD<1:N> stored in the refresh table 24, in operation S53.

When the refresh address REF_ADD is included in the maximum N row addresses TBR_ADD<1:N> stored in the refresh table 24 (that is, "YES" in operation S53), the table management circuit 1200 may up-count the counting number of a row address having the same value as the refresh address REF_ADD among the maximum N row addresses TBR_ADD<1:N> stored in the refresh table 24 and determine the up-counted number as the counting number of the refresh address REF_ADD, in operation S56.

The table management circuit 1200 may check whether the counting number of the refresh address REF_ADD determined in operation S56 exceeds a reference number ST_CNT, in operation S57.

When the counting number of the refresh address REF_ADD exceeds the reference number ST_CNT (that is, "YES" in operation S57), the table management circuit 1200 may perform an eviction operation on a word line selected by the refresh address REF_ADD among K word lines included in the volatile memory region 1010, in operation S58. In this case, the eviction operation may refer to an operation of outputting data stored in the word line selected by the refresh address REF_ADD to the outside of the volatile memory region 1010, and then initializing the selected word line.

After operation S58, the table management circuit 1200 may delete the row address having the same value as the refresh address REF_ADD among the maximum N row addresses TBR_ADD<1:N> stored in the refresh table 24 from the refresh table 24 in operation S59.

When the counting number of the refresh address REF_ADD determined in operation S56 is less than or equal to the reference number ST_CNT (that is, "NO" in step S57), the table management circuit 1200 may update the counting number of the row address having the same value as the refresh address REF_ADD among the maximum N row addresses TBR_ADD<1:N> stored in the refresh table 24 to the counting number of the refresh address REF_ADD determined in operation S56, perform a refresh operation on the word line selected by the refresh address REF_ADD among the K word lines included in the volatile memory region 1010, and then wait for the new command signal CMD to be applied from the outside, in operation S62.

When the refresh address REF_ADD is not included in the maximum N row addresses TBR_ADD<1:N> stored in the refresh table 24 (that is, "NO" in operation S53), the table management circuit 1200 may determine the counting number of the refresh address REF_ADD as a predetermined number in operation S55.

After operation S55, the table management circuit 1200 may check whether an empty space is present in the refresh table 24, in operation S60.

When the empty space is present in the refresh table 24 (that is, "YES" in operation S60), the table management circuit 1200 may store the refresh address REF_ADD whose counting number is determined as the predetermined number in the empty space, perform the refresh operation on the word line selected by the refresh address REF_ADD among the K word lines included in the volatile memory region 1010, and then wait for the new command signal CMD to be applied from the outside, in operation S62.

When the empty space is not present in the refresh table 24 (that is, "NO" in operation S60), the table management circuit 1200 may check whether the counting number of each of the maximum N row addresses TBR_ADD<1:N> stored in the refresh table 24 exceeds the predetermined number, in operation S61.

When the empty space is not present in the refresh table 24, and the counting number of each of the maximum N row addresses TBR_ADD<1:N> stored in the refresh table 24 exceeds the predetermined number (that is, "YES" in operation S61), the table management circuit 1200 may not store the refresh address REF_ADD in the refresh table 24, perform the refresh operation on the word line selected by the refresh address REF_ADD among the K word lines included in the volatile memory region 1010, and then wait for the new command signal CMD to be applied from the outside.

When the empty space is not present in the refresh table 24, and one or more row addresses each having the predetermined number are included in the maximum N row addresses TBR_ADD<1:N> stored in the refresh table 24 (that is, "NO" in operation S61), the table management circuit 1200 may store the refresh address REF_ADD whose counting number is determined as the predetermined number by replacing a corresponding row address, perform the refresh operation on the word line selected by the refresh address REF_ADD among the K word lines included in the volatile memory region 1010, and then wait for the new command signal CMD to be applied from the outside, in operation S62. In this case, the corresponding row address may refer to one of the one or more row addresses each having the predetermined number stored in the refresh table 24.

FIGS. 6 to 10 are diagrams for describing a management operation of the refresh table 24 in the semiconductor memory device 1000 in accordance with an embodiment of the present disclosure.

Referring to FIGS. 6 to 10, it may be seen that the refresh table 24 described above with reference to FIGS. 1 and 2 includes an address storage space 241 for storing the maximum N row addresses TBR_ADD<1:N> and a counting storage space 242 for storing the maximum N counting numbers TBR_CNT<1:N> corresponding to the maximum N row addresses TBR_ADD<1:N>. Hereinafter, the management operation is described based on that "N" is 5.

Referring to FIG. 6, it may be seen that address values "5, 15, 12 and 20" are stored in the four spaces TBR_ADD<1:4>, respectively, and counting numbers "350, 300, 280 and 1" are stored in the four spaces TBR_CNT<1:4>, respectively, among the five spaces TBR_ADD<1:5> and TBR_CNT<1:5> included in the refresh table 24, and the spaces TBR_ADD<5> and TBR_CNT<5> are empty spaces.

In addition, it may be seen that the reference count ST_CNT is set to 350.

Referring to FIG. 7, the table management circuit 1200 may check whether a row address having a value of "30" is stored in the four spaces TBR_ADD<1:4> in which the address values are stored among the five address storage spaces TBR_ADD<1:5> included in the refresh table 24, in response to the refresh address REF_ADD having a value of "30" being inputted together with the refresh command REF_CMD. As a check result, the table management circuit 1200 may check that the refresh address REF_ADD having the value of "30" is a row address that is not stored in the refresh table 24.

In addition, the table management circuit 1200 may check that empty spaces TBR_ADD<5> and TBR_CNT<5> are present in the refresh table 24.

Accordingly, the table management circuit 1200 may store the row address having the value of "30" and a value of "1", which is set to a counting number, in the empty spaces TBR_ADD<5> and TBR_CNT<5> of the refresh table 24, respectively. That is, the table management circuit 1200 may store the row address having the value of "30" in the empty address storage space TBR_ADD<5> included in the refresh table 24, and may store the counting number, determined as the value of "1", in the empty counting storage space TBR_CNT<5> corresponding to the empty address storage space TBR_ADD<5>.

Referring to FIG. 8, the table management circuit 1200 may check that no empty space is present in the five address storage spaces TBR_ADD<1:5> included in the refresh table 24 because address values are stored in all five address storage spaces TBR_ADD<1:5> in response to the refresh address REF_ADD having a value of "50" being inputted together with the refresh command REF_CMD, and may check whether a row address having the value of "50" is present in each of the five address storage spaces TBR_ADD<1:5>.

As a check result, the table management circuit 1200 may check that the refresh address REF_ADD having the value of "50" is a row address that is not stored in the refresh table 24.

Accordingly, the table management circuit 1200 may check whether a counting number having a value of "1" is present in the five counting storage spaces TBR_CNT<1:5> included in the refresh table 24.

As a check result, the table management circuit 1200 may check that the counting number having the value of "1" is stored in two counting storage spaces TBR_CNT<4:5> included in the refresh table 24.

Accordingly, the table management circuit 1200 may replace a row address stored in an address storage space TBR_ADD<4> or TBR_ADD<5> corresponding to any of the two counting storage spaces TBR_CNT<4:5> in which the counting number having the value of "1" is stored, and may store the refresh address REF_ADD having the value of "50" as the row address having the value of "50". It may be seen that FIG. 8 illustrates as an example an operation in which the table management circuit 1200 selects the address storage space TBR_ADD<4> in which a row address having a value of "20" is stored between the two address storage spaces TBR_ADD<4:5> in which the counting number having the value of "1" is stored, and stores the row address having the value of "50", in lieu of the row address having the value of "20", in the address storage space TBR_ADD<4>.

Unlike the operation illustrated in FIG. 8, it is possible to perform an operation in which the table management circuit 1200 selects the address storage space TBR_ADD<5> in which a row address having a value of "30" is stored among the two address storage spaces TBR_ADD<4:5> in which the counting number having the value of "1" is stored and stores the refresh address REF_ADD having the value of "50", in lieu of the row address having the value of "30", as the row address having the value of "50" in the address storage space TBR_ADD<5>.

Referring to FIG. 9, the table management circuit 1200 may check that no empty space is present in the five address storage spaces TBR_ADD<1:5> included in the refresh table 24 because address values are stored in all five address storage spaces TBR_ADD<1:5> in response to the refresh address REF_ADD having a value of "5" being inputted together with the refresh command REF_CMD, and may check whether a row address having the value of "5" is present in each of the five address storage spaces TBR_ADD<1:5>.

As a check result, the table management circuit 1200 may check that the refresh address REF_ADD having the value of "5" is a row address that is stored in the refresh table 24.

Accordingly, the table management circuit 1200 may check a counting number "350" corresponding to the row address having the value of "5" in the refresh table 24, up-count (+1) the counting number "350", and determine the counting number REF_CNT of the refresh address REF_ADD as "351".

When the counting number REF_CNT of the refresh address REF_ADD is determined as "351", the table management circuit 1200 may check that the counting number REF_CNT of the refresh address REF_ADD exceeds "350", which is the reference number ST_CNT, and delete the row address having the value of "5", which is equal to the value of the refresh address REF_ADD, from the refresh table 24 by enabling the eviction control signal EXSIG. That is, the table management circuit 1200 may make, as empty spaces, the address storage space TBR_ADD<1> in which the row address having the value of "5", which is equal to the value of the refresh address REF_ADD, among the five address storage spaces TBR_ADD<1:5> included in the refresh table 24 is stored, and the counting storage space TBR_CNT<1> in which the counting number corresponding to the row address having the value of "5" is stored.

The refresh operation circuit 1210 may perform the eviction operation on a word line selected by the refresh address REF_ADD, in response to the eviction control signal EXSIG being enabled by the table management circuit 1200.

Referring to FIG. 10, the table management circuit 1200 may check whether a row address having a value of "15" is present in each of the five address storage spaces TBR_ADD<1:5> included in the refresh table 24, in response to the column operation address COLA_ADD having a value of "15" being inputted together with the column operation command COLA_CMD.

As a check result, the table management circuit 1200 may check that the column operation address COLA_ADD having the value of "15" is a row address stored in the refresh table 24.

Accordingly, the table management circuit 1200 may delete the row address having the value of "15", which is equal to the value of the column operation address COLA_ADD, from the refresh table 24. That is, the table management circuit 1200 may make, as empty spaces, the address storage space TBR_ADD<2> in which the row address having the value of "15", which is equal to the value of the column operation address COLA_ADD, is stored among the five address storage spaces TBR_ADD<1:5> included in the refresh table 24, and the counting storage space TBR_CNT<1> in which the counting number corresponding to the row address having the value of "15" is stored.

The column operation circuit 1090 may perform the column operation on a word line selected by the column operation address COLA_ADD.

In accordance with embodiments of the present disclosure, a volatile memory device may count, for each row, the number of times that a row address is used for a refresh operation, select some row addresses having relatively high counting numbers, store the selected row addresses, and then define data, which is stored in a row having a counting number exceeding a reference number among the stored addresses, as cold data.

In addition, in accordance with embodiments of the present disclosure, the cold data stored in the volatile memory device may be evicted from the volatile memory device, and the evicted cold data are stored in a non-volatile memory device, thereby reducing power consumption for retaining data stored in the volatile memory device.

While the present disclosure has been illustrated and described with respect to specific embodiments, it will be apparent to those skilled in the art that various changes and modifications may be made without departing from the spirit and scope of the present disclosure as defined in the following claims. Therefore, the scope of the present disclosure encompasses all variations that fall within the scope of the claims including their equivalents. Furthermore, the embodiments may be combined to form additional embodiments.

What is claimed is:

1. A memory device comprising:
   a volatile memory cell array coupled to a plurality of word lines;
   a refresh operation circuit configured to perform, in response to one of a refresh command and an eviction control signal, a corresponding one of a refresh operation and an eviction operation on a word line selected by a refresh address among the word lines; and
   a table management circuit configured to:
   count, as respective counting numbers for each of a plurality of row addresses, a number of times that each of the row addresses corresponding to the word lines is used for the refresh operation,
   select, as a selected row addresses, one or more among the row addresses on the basis of the respective counting numbers corresponding to the plurality of row addresses,
   store the selected row addresses in a refresh table, and
   control whether to enable the eviction control signal on the basis of a row address having a counting number exceeding a reference number among the selected row addresses stored in the refresh table.

2. The memory device of claim 1, wherein the table management circuit includes:
   a first comparison circuit configured to compare the refresh address with the selected row addresses stored in the refresh table and determine a counting number of the refresh address on the basis of a result of the comparison thereof;
   a second comparison circuit configured to compare the counting number of the refresh address with the reference number and selectively enable the eviction control signal according to a result of the comparison thereof; and
   a storage management circuit configured to manage, according to the results of the comparison of the first and second comparison circuits, the refresh table to store, as the selected row addresses, maximum N number of row addresses each having a counting number that is relatively high among less than or equal to the reference number.

3. The memory device of claim 2,
   wherein the first comparison circuit determines the counting number of the refresh address by:
   up-counting, when a row address having the same value as the refresh address is included in the N row addresses stored in the refresh table, a counting number of the row address, which having the same value as the refresh address, to determine the up-counted counting number as the counting number of the refresh address, and
   determining, when a row address having the same value as the refresh address is not included in the N row addresses stored in the refresh table, the counting number of the refresh address to a predetermined number less than the reference number, and
   wherein the first comparison circuit is further configured to enable a comparison signal when the row address having the same value as the refresh address is included in the N row addresses stored in the refresh table, and disable the comparison signal when a row address having the same value as the refresh address is not included in the N row addresses stored in the refresh table.

4. The memory device of claim 3,
   wherein the second comparison circuit enables the eviction control signal when the counting number of the refresh address determined by the first comparison circuit exceeds the reference number, and
   wherein the second comparison circuit disables the eviction control signal when the counting number of the refresh address is less than or equal to the reference number.

5. The memory device of claim 4, wherein the storage management circuit manages the refresh table by:

deleting a row address having the same value as the refresh address, among the N row addresses, from the refresh table when the eviction control signal is in an enabled state, updating, to the counting number determined by the first comparison circuit, a counting number of a row address having the same value as the refresh address, among the N row addresses, within the refresh table when the eviction control signal is in a disabled state and the comparison signal is in an enabled state, and selectively storing, in the refresh table, the refresh address whose counting number is determined as the predetermined number by the first comparison circuit when both the eviction control signal and the comparison signal are in disabled states.

6. The memory device of claim 5, wherein the storage management circuit selectively stores, in the refresh table, the refresh address whose counting number is determined as the predetermined number by the first comparison circuit when both the eviction control signal and the comparison signal are in the disabled states, by:

storing, when an empty space is present in the refresh table, the refresh address having the predetermined number in the empty space, replacing, when an empty space is not present in the refresh table and at least one row address having the predetermined number is included in the N row addresses, the at least one row address having the predetermined number with the refresh address having the predetermined number, and keeping, when an empty space is not present in the refresh table and a counting number of each of the N row addresses exceeds the predetermined number, the addresses in the refresh table without storing the refresh address having the predetermined number in the refresh table.

7. The memory device of claim 2, further comprising a column operation circuit configured to perform, in response to a column operation command, a column operation on a word line selected by a column operation address among the word lines, wherein the table management circuit further includes a third comparison circuit configured to compare the column operation address with each of the N row addresses stored in the refresh table, and wherein the storage management circuit is further configured to delete a row address having the same value as the column operation address from the refresh table when the refresh table is determined to have the row address having the same value as the column operation address as a result of the comparing by the third comparison circuit.

8. The memory device of claim 2, wherein the refresh operation circuit performs, in response to a refresh command and enabled the eviction control signal, the eviction operation on the word line selected by the refresh address, and wherein the refresh operation circuit performs, in response to the refresh command and disabled the eviction control signal, the refresh operation on the word line selected by the refresh address.

9. The memory device of claim 8, wherein the eviction operation includes operations of:

moving data stored in the word line selected by the refresh address to an outside of the volatile memory cell array, and initializing the word line selected by the refresh address.

10. The memory device of claim 9, further comprising a data register configured to output data stored therein to the outside in response to a data movement command, wherein the refresh operation circuit stores the data, stored in the word line selected by the refresh address, in the data register through the eviction operation.

11. A memory system comprising:

a non-volatile memory device;

a volatile memory device configured to define, as cold data, data stored in a word line, on which a refresh operation is performed a number of times greater than a reference number among a plurality of word lines coupled to a volatile memory cell array, and evict the cold data; and a controller configured to control operations of the volatile memory device and the non-volatile memory device, and store the evicted cold data into the non-volatile memory device, wherein the volatile memory device includes:

the volatile memory cell array coupled to the word lines;

a refresh operation circuit configured to evict the cold data by performing, in response to a refresh command and enabled an eviction control signal, an eviction operation on a word line selected by a refresh address among the word lines, and perform, in response to the refresh command and disabled the eviction control signal, a refresh operation on the word line selected by the refresh address; and a table management circuit configured to count, as respective counting numbers for each of a plurality of row addresses, a number of times that each of the row addresses corresponding to the word lines is used for the refresh operation, select, as a selected row addresses, one or more among the row addresses on the basis of the respective counting numbers corresponding to the plurality of row addresses, store the selected row addresses in a refresh table, and control whether to enable the eviction control signal on the basis of a row address having a counting number exceeding a reference number among the selected row addresses stored in the refresh table.

12. The memory system of claim 11, wherein the table management circuit enables the eviction control signal when the refresh address is one of the selected row addresses stored in the refresh table and a counting number of the refresh address exceeds the reference number.

13. The memory system of claim 12, wherein the eviction operation includes operations of:

moving the cold data stored in the word line selected by the refresh address to an outside of the volatile memory cell array, and initializing the word line selected by the refresh address.

14. The memory system of claim 13, wherein the volatile memory device further includes a data register configured to output the cold data stored therein to the outside in response to a data movement command, wherein the refresh operation circuit defines, as the cold data, the data stored in the word line selected by the refresh address, and stores the cold data in the data register through the eviction operation, wherein the controller is further configured to generate the data movement command to transmit the data movement command to the volatile memory device, and wherein the controller stores the cold data, which is output from the data register, in the non-volatile memory device.

15. A data processing system comprising:
a memory system including a non-volatile memory device; and
a host including a volatile memory device configured to define, as cold data, data stored in a word line, on which a refresh operation is performed a number of times greater than a reference number among a plurality of word lines coupled to a volatile memory cell array, and evict the cold data; and
a processor configured to store the evicted cold data into the non- volatile memory device,
wherein the volatile memory device includes:
the volatile memory cell array coupled to the word lines;
a refresh operation circuit configured to evict the cold data by performing, in response to a refresh command and enabled an eviction control signal, an eviction operation on a word line selected by a refresh address among the word lines, and perform, in response to the refresh command and disabled the eviction control signal, a refresh operation on the word line selected by the refresh address; and
a table management circuit configured to count, as respective counting numbers for each of a plurality of row addresses, a number of times that each of the row addresses corresponding to the word lines is used for the refresh operation, select, as a selected row addresses, one or more the row addresses on the basis of the respective counting numbers corresponding to the plurality of row addresses, store the selected row addresses in a refresh table, and control whether to enable the eviction control signal on the basis of a row address having a counting number exceeding a reference number among the selected row addresses stored in the refresh table.

16. The data processing system of claim 15, wherein the table management circuit enables the eviction control signal when the refresh address is one of the selected row addresses stored in the refresh table and a counting number of the refresh address exceeds the reference number.

17. The data processing system of claim 16, wherein the eviction operation includes operations of:
moving the cold data stored in the word line selected by the refresh address to an outside of the volatile memory cell array, and
initializing the word line selected by the refresh address.

18. The data processing system of claim 17,
wherein the volatile memory device further includes a data register configured to output the cold data stored therein to the outside in response to a data movement command,
wherein the refresh operation circuit defines, as the cold data, the data stored in the word line selected by the refresh address, and stores the cold data in the data register through the eviction operation,
wherein the processor is further configured to generate the data movement command to transmit the data movement command to the volatile memory device, and
wherein the processor stores the cold data, which is output from the data register, in the non-volatile memory device.

* * * * *